United States Patent [19]
Nozue

[11] Patent Number: 6,034,375
[45] Date of Patent: Mar. 7, 2000

[54] METHOD OF ALIGNING A SEMICONDUCTOR SUBSTRATE WITH A BASE STAGE AND APPARATUS FOR DOING THE SAME

[75] Inventor: Hiroshi Nozue, Tokyo, Japan

[73] Assignee: NEC Corporation, Tokyo, Japan

[21] Appl. No.: 09/046,037

[22] Filed: Mar. 23, 1998

[30] Foreign Application Priority Data

Apr. 11, 1997 [JP] Japan .................................. 9-110441

[51] Int. Cl.[7] .................................................. H01J 37/304
[52] U.S. Cl. ......................................................... 250/491.1
[58] Field of Search ........................................... 250/491.1

[56] References Cited

U.S. PATENT DOCUMENTS

| 4,812,661 | 3/1989 | Owen | 250/491.1 |
| 5,864,142 | 1/1999 | Muraki et al. | 250/491.1 |

FOREIGN PATENT DOCUMENTS

| 57-75428 | 5/1982 | Japan | 250/491.1 |
| 3-194916 | 8/1991 | Japan . | |
| 3-201526 | 9/1991 | Japan . | |
| 2625124 | 4/1997 | Japan . | |

*Primary Examiner*—Jack I. Berman
*Attorney, Agent, or Firm*—J. Warren Whitesel; Laff, Whitesel & Saret, Ltd.

[57] ABSTRACT

There is provided a method of aligning a semiconductor substrate with a base stage on which the semiconductor substrate is placed, in the process of forming a circuit pattern directly onto the semiconductor substrate with electron beams, the method including the steps of (a) scanning across an alignment mark formed on a surface of the semiconductor substrate with electron beams with a scanning angle, defined as an angle between a direction of the electron beams and a reference direction, being varied, (b) calculating a width of the alignment mark along a scanning direction for each of scanning angles, and (c) determining a minimum width among widths calculated in the step (b), and defining a scanning angle associated with the minimum width as an angular gap between the semiconductor substrate and the base stage. In accordance with the above-mentioned method, it is possible to align a semiconductor substrate with an X-Y stage with the less number of movements of the X-Y stage, which ensures a higher efficiency in exposing a semiconductor substrate to electron beams.

25 Claims, 7 Drawing Sheets

METHOD OF ALIGNING A SEMICONDUCTOR SUBSTRATE WITH A BASE STAGE AND APPARATUS FOR DOING THE SAME

BACKGROUND OF THE INVENTION

1. Field of the Invention

The invention relates to a method and apparatus of electron beam alignment, namely, a method and apparatus for aligning a semiconductor substrate with a base stage on which the substrate is placed, by employing electron beams, and more particularly to a method and apparatus of forming a circuit pattern such as a pattern for a semiconductor integrated circuit, directly onto a semiconductor substrate with electron beams.

2. Description of the Related Art

In the field of a semiconductor integrated circuit, there has been facilitated fabrication of LSI such as custom LSI and semi-custom LSI, which is to be fabricated in the small number but in the variety of kinds. As a fabrication process for fulfilling such requirement, there has been widely used electron beam radiating apparatus. The reason why the electron beam radiating apparatus is so used is as follows. The electron beam radiating apparatus does not employ a mask and a reticle unlike a projection exposure apparatus. The electron beam radiating apparatus forms a circuit pattern directly onto a semiconductor substrate in accordance with a pattern data, and hence it is possible to shorten a fabrication term by a term for making a mask or a reticle. In addition, since a cost for making a mask or reticle can be saved, the total cost for fabricating a semiconductor integrated circuit can be reduced.

Figure 1:
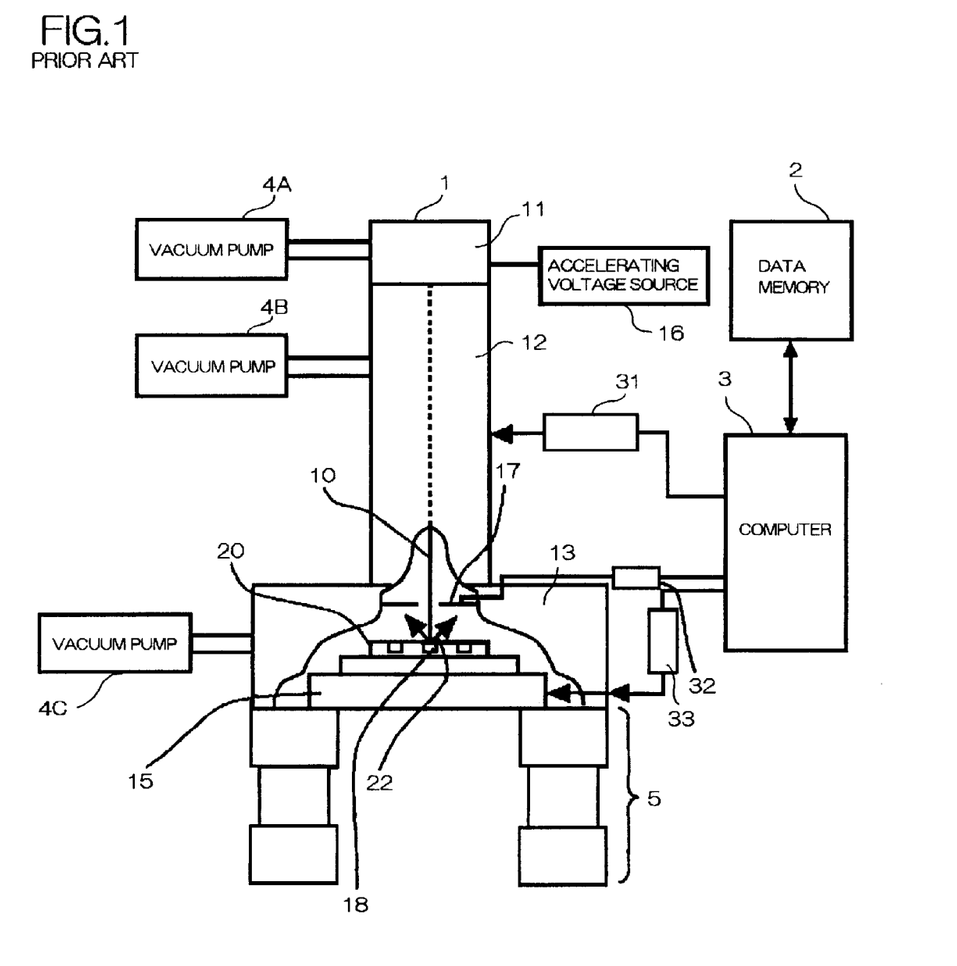
FIG. 1 is a schematic view illustrating a conventional electron beam radiating apparatus.

FIG. 1 illustrates one of conventional electron beam radiating apparatuses. The illustrated electron beam radiating apparatus includes a main body 1 and a sample chamber 13.

The main body 1 includes an electron gun 11 for emitting electrons therefrom, an accelerating voltage source 16 for accelerating electrons emitted from the electron gun 11 to thereby form electron beams 10, and an electron mirror cylinder 12 including electromagnetic lenses, apertures and electrodes for focusing the electron beams 10 onto a certain spot, blanking the electron beams 10, directing the electron beams 10 onto a desired spot, and determining an amount of the electron beams 10 to be radiated.

The sample chamber 13 includes a support base 21 on which a semiconductor substrate 20 is placed, and an X-Y stage 15 on which the support base 21 is placed for controlling a location of the support base 21. The X-Y stage 15 is controlled its movement in X- and Y-axes directions and its rotation by a stage controller 33. The main body 1 and the sample chamber 13 are made vacuous by means of vacuum pumps 4A, 4B and 4C, and are mounted on vibration isolations 5.

Data about a circuit pattern is stored in a data memory 2. A control unit or computer 3 received data about a circuit pattern from the data memory 2, and controls the electron beams 10 and the X-Y stage 15 in accordance with the received data and predetermined parameters, to thereby form a pattern on the semiconductor substrate 21.

Until LSI is completed, formation of a pattern onto a surface of a semiconductor substrate is repeated a plurality of times. Hence, it is quite important to align a pattern with a next pattern. If a pattern was improperly aligned with a next pattern, a resultant LSI would be a defective one.

In order to avoid such misalignment, at least two alignment marks 18 are formed at a surface of the semiconductor substrate 20. The alignment marks 18 are successively scanned with the electron beams 10 controlled by means of an electron beam deflection control circuit 31. Electron beams 22 reflected from the alignment marks 18 are detected by a reflected electron detector 17, and then the reflected electron detector 17 emits signals to a signal processor 32. The signal processor 32 analyzes the received signals to thereby emit a signal indicative of a position of the alignment marks 18 to the computer 3. The electron beam deflection control circuit 31 emits a signal indicative of scanning directions of the electron beams 10 to the computer 3. The stage controller 33 emits a signal indicative of a position of the X-Y stage 15 to the computer 3.

Based on these signals emitted from the electron beam deflection control circuit 31, the signal processor 32 and the stage controller 33, the computer 3 identifies a position of the alignment marks 18, and calculates a gap in X and Y coordinates between a X-Y coordinate system associated with the X-Y stage 15 and a X-Y coordinate system associated with the semiconductor substrate 20, and further calculates an angular gap between those two X-Y coordinate systems. The computer 3 controls the stage controller 33 which in turn controls the X-Y stage 15 so as to compensate for the thus calculated gap in X and Y coordinates and the angular gap. As a result, a circuit pattern can be formed onto the semiconductor substrate 20 at a desired position.

As mentioned so far, a circuit pattern can be formed at a desired position, and a circuit pattern can be aligned with a next circuit pattern by employing alignment marks as a reference.

The above-mentioned gap in X and Y coordinates between a X-Y coordinate system associated with the X-Y stage 15 and a X-Y coordinate system associated with the semiconductor substrate 20, and the angular gap between those two X-Y coordinate systems are measured as follows. The electron beams 10 are accelerated by applying an acceleration voltage in the range of 20 kV to 50 kV thereto, and the alignment marks 18 are successively scanned with the thus accelerated electron beams 10. The electron beams 22 reflected from the alignment marks 18 are captured by the reflected electron detector 17. Then, the computer 3 determines a position of the alignment marks 18 based on the signals emitted from the reflected electron detector 17 through the signal processor 32, and subsequently calculates the above-mentioned gaps based on the thus determined position of the alignment marks 18.

As mentioned earlier, the above-mentioned conventional electron beam radiating apparatus scans at least two alignment marks with electron beams in order to determine the gap in X and Y coordinates between a X-Y coordinate system associated with the X-Y stage 15 and a X-Y coordinate system associated with the semiconductor substrate 20, and the angular gap between those two X-Y coordinate systems.

As illustrated in FIG. 1, the alignment marks 18 are spaced with one another. Hence, after the computer 3 recognizes a position of a first alignment mark by scanning with the electron beams 10, the computer 3 moves the X-Y stage 15 so that the electron beams 10 is radiated to a second alignment mark.

However, it takes a time for the X-Y stage 15 to move, and hence a wafer-processing ability of the electron beam radiating apparatus is significantly reduced. This problem is discussed in detail hereinbelow with reference to FIG. 2 partially illustrating a surface of the semiconductor substrate 20 placed on the X-Y stage 15.

Figure 2:
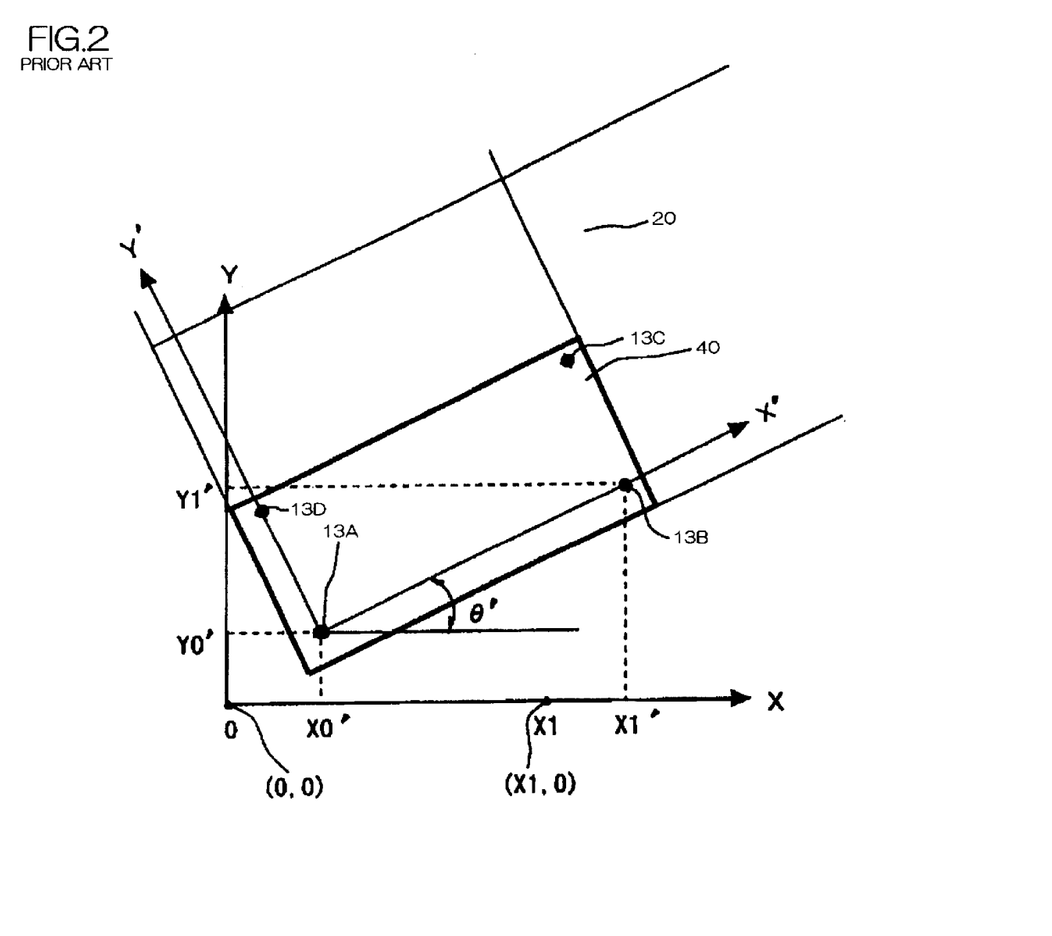
FIG. 2 is an enlarged view for pointing out a problem in the prior art, illustrating a part of a semiconductor substrate on which a semiconductor device is being fabricated.

Referring to FIG. 2, a semiconductor device 40 is being fabricated on the semiconductor substrate 20. The semiconductor device 40 has an X'-Y' coordinate system. On a surface of the semiconductor device 40, a first alignment mark 13A is formed at an origin, namely, at a coordinate (0, 0) of the X'-Y' coordinate system, and a second alignment mark 13B is formed at a coordinate (X1, 0) of the X'-Y' coordinate system. The X-Y stage 15 on which the semiconductor device 40 is placed has an X-Y coordinate system.

The X'-Y' coordinate system associated with the semiconductor device 40 is generally not aligned with the X-Y coordinate system associated with the X-Y stage 15 because of a dispersion in outer shapes of the semiconductor substrate 20 and a dispersion in an accuracy with which the semiconductor substrate 20 is placed on the X-Y stage 15. Hence, the alignment marks 13A and 13B are scanned with the electron beams 10 to thereby determine positions of the alignment marks 13A and 13B. Based on the thus determined positions of the alignment marks 13A and 13B, there are calculated a gap in X and Y coordinates between the X'-Y' coordinate system associated with the semiconductor device 40 and the X-Y coordinate system associated with the X-Y stage 15, and an angular gap θ' between the X'-Y' coordinate system and the X-Y coordinate system.

First, the computer 3 moves the X-Y stage 15 so that the first alignment mark 13A is located just in the spot of the electron beams 10. The first alignment mark 13A located at a coordinate (0, 0) in the X'-Y' coordinate system has to be located at a coordinate (0, 0) in the X-Y coordinate system. However, as mentioned above, the first alignment mark 13A is generally not located at a coordinate (0, 0) in the X-Y coordinate system. Hence, by scanning the first alignment mark 13A with the electron beams 10, there is determined a coordinate (X0', Y0') of the first alignment mark 13A in the X-Y coordinate system.

Thus, there is determined a gap in X and Y coordinates between the X'-Y' coordinate system associated with the semiconductor device 40 and the X-Y coordinate system associated with the X-Y stage 15. In order to determine the angular gap θ', it is necessary to determine the second alignment mark 13B.

Thus, the computer 3 moves the X-Y stage 15 so that the second alignment mark 13B is located just in the spot of the electron beams 10. The second alignment mark 13B located at a coordinate (X1, 0) in the X'-Y' coordinate system has to be located at a coordinate (X1, 0) in the X-Y coordinate system. Similarly to the first alignment mark 13A, by scanning the second alignment mark 13B with the electron beams 10, there is determined a coordinate (X1', Y1') of the second alignment mark 13B in the X-Y coordinate system.

Then, the computer 3 calculates a gap X0' in a X-axis direction between the X'-Y' coordinate system and the X-Y coordinate system, a gap Y0' in a Y-axis direction between the X'-Y' coordinate system and the X-Y coordinate system, and the angular gap $\theta'=\tan^{-1}[(Y1'-Y0')/(X1'-X0')]$.

In the case illustrated in FIG. 2, two alignment marks 13A and 13B are formed per one semiconductor device. If the angular gap θ' was necessary to be measured with higher accuracy, three or greater alignment marks are formed at a surface of the semiconductor device 40.

If four alignment marks were formed at a surface of the semiconductor device 40, the X-Y stage 15 has to be moved three times. Though it depends on a kind of a semiconductor device, there are generally formed tens of to hundreds of semiconductor devices on a semiconductor substrate. For example, if there were formed hundred semiconductor devices on a semiconductor substrate where each of the semiconductor devices has four alignment marks, the X-Y stage 15 has to be moved three hundred times. It takes about 0.2 seconds for the X-Y stage 15 to move once. Accordingly, it takes 60 seconds for the X-Y stage to move entirely over a semiconductor substrate including hundred semiconductor devices.

As a result, a wafer processing ability of an electron beam radiating apparatus is considerably reduced, which is accompanied with a problem of an increase in fabrication costs of resultant semiconductor devices.

Apart from the above-mentioned electron beam radiating apparatus, there have been suggested similar apparatuses as follows.

Japanese Unexamined Patent Publication No. 3-194916 has suggested an apparatus for detecting a position of an alignment mark. In this apparatus, electron beams are radiated onto an alignment mark, and a position at which a current flowing in a substrate varies is detected based on secondary electrons and secondary ions emitted from the substrate and the alignment mark. A position of the alignment mark is determined based on the thus determined position and data about deflection voltage deflecting the electron beams.

Japanese Unexamined Patent Publication No. 3-201526 has suggested an apparatus for aligning a plurality of semiconductor chips with one another. In this apparatus, an alignment mark is differently positioned from others in the semiconductor chips. Positions of the alignment marks are determined by scanning the alignment marks and detecting an amount of electrons emitted from the scanned alignment marks.

Japanese Patent Publication No. 2625124, which is based on U.S. patent application Ser. No. 898,451 filed on Aug. 20, 1986 and assigned to Hewlett Packard Company, has suggested a lithography method including the steps of forming a chip registration mark on a chip, obtaining a complex parameter by moving a stage on which an integrated circuit chip is mounted and applying deflected electron beams to the chip registration mark, calculating adjustment data from the complex parameter, and applying electron beams to the integrated circuit chip through the use of the adjustment data. The complex parameter is comprised of a stage parameter which is obtained by moving the stage with the electron beams being kept stationary, and a deflection plate parameter which is obtained by deflecting the electron beams with the stage being kept stationary.

However, the above-mentioned Publications are accompanied with the above-mentioned problem. That is, a stage on which a semiconductor device to be processed has to be moved a plurality of times, which considerably reduces a wafer processing ability of the apparatus.

SUMMARY OF THE INVENTION

In view of the above-mentioned problem of the prior art, it is an object of the present invention to provide a method and an apparatus for electron beam alignment both of which are capable of reducing the number of times a stage on which a semiconductor device to be processed is mounted is moved when the stage has to be aligned with the semiconductor device, to thereby enhance a throughput of processing semiconductor devices.

In one aspect, there is provided a method of aligning a semiconductor substrate with a base stage on which the semiconductor substrate is placed, in the process of forming a circuit pattern directly onto the semiconductor substrate with electron beams, the method including the steps of (a) scanning across an alignment mark formed on a surface of the semiconductor substrate with electron beams with a scanning angle, defined as an angle between a direction of the electron beams and a reference direction, being varied, (b) calculating a width of the alignment mark along a scanning direction for each of scanning angles, (c) determining a minimum width among widths calculated in the step (b), and defining a scanning angle associated with the minimum width as an angular gap between the semiconductor substrate and the base stage, and (d) adjusting an angular positional relation between the semiconductor substrate and the base stage based on the angular gap determined in the step (c).

For instance, a width of the alignment mark along a scanning direction for each of scanning angles may be calculated based on electron beams reflected from the alignment mark. Secondary electrons emitted from the alignment mark may be substituted from the electron beams reflected from the alignment mark.

It is preferable that the reference direction is an X-axis direction of the base stage. It is preferable that the alignment mark is scanned a plurality of times for each of the scanning angles.

The alignment mark may be designed in various forms. For instance, the alignment mark may be comprised of a straight line having a certain width. As an alternative, the alignment mark may be comprised of a plurality of straight lines each having a certain width, arranged in parallel with one another, in which case, it is preferable that the straight lines have the same width. The alignment mark may be comprised of a mark including at least one straight-line portion. As an alternative, the alignment mark may be comprised of straight-line portions having different widths.

In another aspect of the invention, there is provided an electron beam radiating apparatus for forming a circuit pattern directly onto a semiconductor substrate with electron beams, including (a) an X-Y stage on which a semiconductor substrate is to be placed, (b) an electron beam scanner for scanning across an alignment mark formed on a surface of the semiconductor substrate with electron beams with a scanning angle, defined as an angle between a direction of the electron beams and a reference direction, being varied, (c) a control unit for calculating a width of the alignment mark along a scanning direction for each of scanning angles, determining a minimum width among the thus calculated widths, and defining a scanning angle associated with the minimum width as an angular gap between the semiconductor substrate and the X-Y stage, and (d) an adjuster for rotating the X-Y stage relative to the semiconductor substrate to compensate for the angular gap.

It is preferable that the control unit calculates a width of the alignment mark along a scanning direction for each of scanning angles, based on electron beams reflected from the alignment mark or based on secondary electrons emitted from the alignment mark.

The electron beam scanner preferably scans the alignment mark a plurality of times for each of the scanning angles.

In still another aspect of the invention, there is provided a combination of an electron beam radiating apparatus and a semiconductor substrate onto which a circuit pattern is to be directly formed with electron beams emitted from the electron beam radiating apparatus, the semiconductor substrate being formed on a surface thereof with an alignment mark having a certain width, the electron beam radiating apparatus including (a) an X-Y stage on which the semiconductor substrate is to be placed, (b) an electron beam scanner for scanning across the alignment mark with electron beams with a scanning angle, defined as an angle between a direction of the electron beams and a reference direction, being varied, and (c) a control unit for calculating a width of the alignment mark along a scanning direction for each of scanning angles, determining a minimum width among the thus calculated widths, and defining a scanning angle associated with the minimum width as an angular gap between the semiconductor substrate and the X-Y stage.

In accordance with the above-mentioned invention, a width of an alignment mark is determined by scanning the alignment mark with electron beams with the scanning angle being varied. The angular gap is defined as a scanning angle associated with a minimum width among the thus determined widths. Namely, the invention makes it possible to determine an angular gap between an X-Y coordinate system associated with a semiconductor substrate and an X-Y coordinate system associated with a base stage without moving the base stage. Hence, it is now possible to considerably enhance a processing ability of an electron beam radiating apparatus, which ensures mass-production of highly qualified semiconductor devices at lower fabrication costs.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

An electron beam radiating apparatus in accordance with the first embodiment has the same structure as that of the electron beam radiating apparatus illustrated in FIG. 1.

However, the computer 3 in the electron beam apparatus in the instant embodiment is designed to control the electron beam deflection control circuit 31 to scan across an alignment mark with the electron beams 10 with a scanning angle being varied. Herein, a scanning angle is defined as an angle formed between a direction in which the electron beams 10 are radiated and a reference direction. In the instant embodiment, the reference direction is defined as an X-axis direction in an X-Y coordinate system associated with the X-Y stage 15.

In addition, the computer 3 is designed to calculate a width of an alignment mark along a scanning direction for each of scanning angles, and then determines a minimum width among the thus calculated widths. A scanning angle associated with the thus determined minimum width is defined as an angular gap between an X-Y coordinate system associated with the X-Y stage 15 and an X'-Y' coordinate system associated with the semiconductor device 40.

Hereinbelow is explained an operation of the electron beam radiating apparatus in accordance with the instant embodiment.

Figure 3:
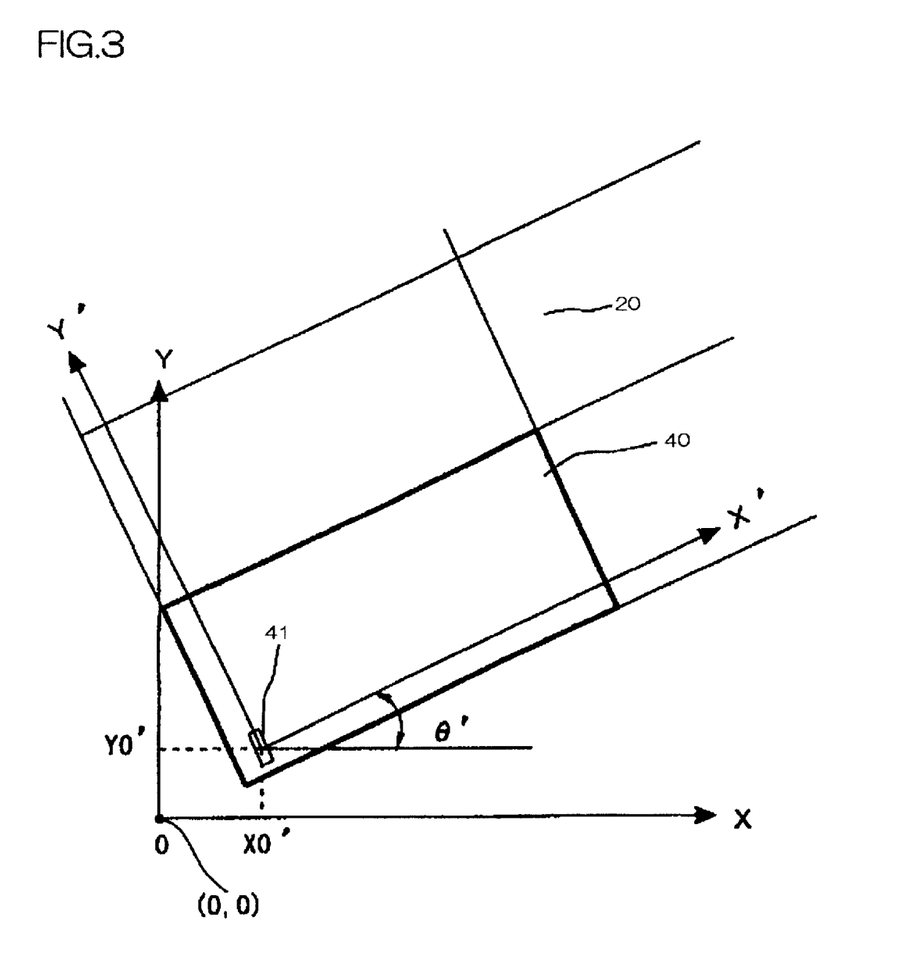
FIG. 3 is an enlarged view for explaining the first embodiment in accordance with the first embodiment, illustrating a part of a semiconductor substrate on which a semiconductor device is being fabricated.
Figures 4A, 4B:
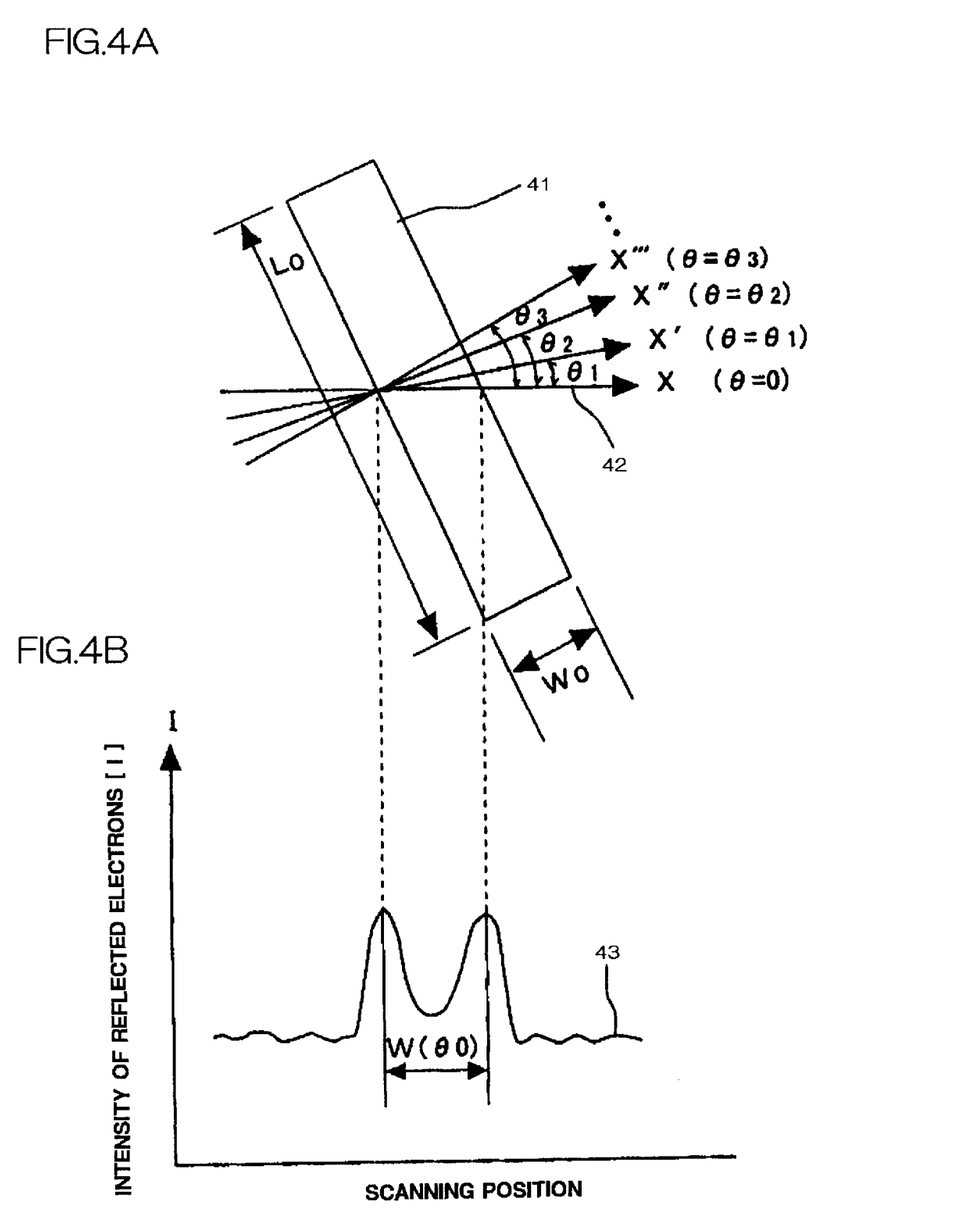
FIG. 4A is an enlarged view of an alignment mark in accordance with the first embodiment.
FIG. 4B illustrates a waveform of a signal indicative of electrons reflected from an alignment mark.

With reference to FIG. 3, a semiconductor device 40 is being fabricated on the semiconductor substrate 20. The semiconductor device 40 has an X'-Y' coordinate system. On a surface of the semiconductor device 40, an alignment mark 41 is formed at an origin, namely, at a coordinate (0, 0) of the X'-Y' coordinate system. The alignment mark 41 is a rectangle having a longer side having a length L0 in a Y'-axis direction and a shorter side having a length W0 in an X'-axis direction, as illustrated in FIG. 4A. The X-Y stage 15 on which the semiconductor device 40 is placed has an X-Y coordinate system.

An angular gap θ' between the X'-Y' coordinate system associated with the semiconductor device 40 and the X-Y coordinate system associated with the X-Y stage 15 is determined as follows.

First, as illustrated in FIG. 4A, the alignment mark 41 is scanned with an electron beam 42 in a direction parallel to the X-axis direction (θ=0) of the X-Y coordinate system associated with the X-Y stage 15 in such a manner that the electron beam 42 runs entirely across the alignment mark 41. In synchronization with scanning, an intensity of electrons reflected from the alignment mark 41 is detected by means of the reflected electron detector 17. The thus detected intensity of the reflected electrons shows a curve 43 as illustrated in FIG. 4B.

Based on the thus obtained curve 43, a width W(θ0) of the alignment mark 41 along the scanning direction (θ=0) is determined by virtue of a signal processing algorithm such as a peak detecting method, a threshold method or differentiation. In order to provide high reliability to the measured width of the alignment mark 41 along the scanning direction, it is preferable to repeat scanning in the same direction a plurality of times.

Then, the computer 3 controls the electron beam deflection control circuit 31 so as to rotate the scanning direction of the electron beam 42 by an angle of θ1 in a counter-clockwise direction. Then, the alignment mark 41 is scanned with the electron beam 42 in a direction X'(θ=θ1) of the X-Y coordinate system associated with the X-Y stage 15 in such a manner that the electron beam 42 runs entirely across the alignment mark 41. Similarly to the width W(θ0), a width W(θ1) of the alignment mark 41 along the scanning direction (θ=θ1) is determined based on the obtained curve 43.

Then, the scanning direction of the electron beam 42 is rotated by an angle of θ2, θ3,—, in a counterclockwise direction. Namely, the scanning direction is successively varied to directions X", X'",—, as illustrated in FIG. 4A. Then, a width W(θ2), W(θ3),—of the alignment mark 41 along each of the scanning directions (θ=θ2, θ=θ3,—) is determined based on the obtained curve 43.

Figure 5:
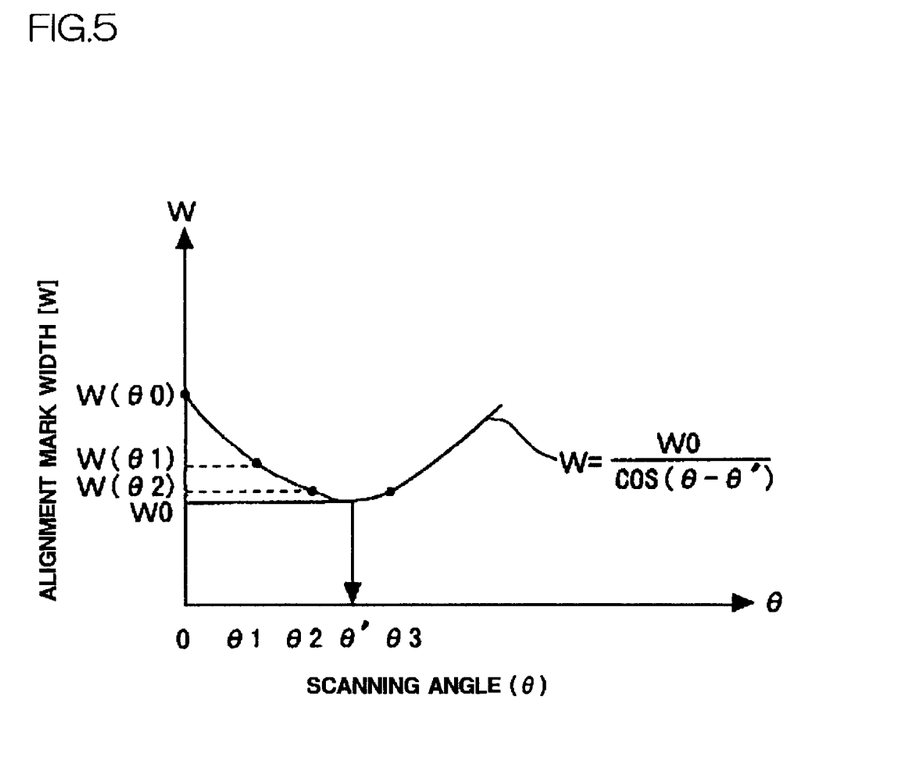
FIG. 5 is a graph showing a relation between a width of an alignment mark and a scanning direction.

Then, the thus obtained widths W(θ0), W(θ1), W(θ2), W(θ3),—are plotted in association with each of the scanning directions (θ=0, θ=θ1, θ=θ2, θ=θ3). Thus, there is obtained FIG. 5 showing a relation between the width W(θ0), W(θ1), W(θ2), W(θ3) of the alignment mark 41 and the scanning directions (θ=0, θ1, θ2, θ3).

Suppose the X'-Y' coordinate system associated with the semiconductor device 40 is rotated by an angle θ' relative to the X-Y coordinate system associated with the X-Y stage 15, a relation between a scanning angle θ and a width W of the alignment mark 41 is given by the following equation.

$$W = W0/\cos(\theta - \theta')$$

It is understood in view of this equation that when a scanning angle θ is equal to an angle θ', a measured width W of the alignment mark 41 will make a minimum value, namely, is equal to the length W0 of the shorter side of the alignment mark 41. Accordingly, a scanning direction θ associated with a minimum width W of the alignment mark 41 is equal to the angular gap θ' between the X-Y coordinate system associated with the X-Y stage 15 and the X'-Y' coordinate system associated with the semiconductor device 40.

Thus, in accordance with the instant embodiment, it is possible to determine the angular gap θ' without moving or rotating the X-Y stage 15. Though the graph illustrated in FIG. 5 was made for better understanding of the instant embodiment, it should be noted that, in actual, the computer 3 automatically determines the angular gap θ' without plotting the widths W and the scanning angles θ.

In the instant embodiment, the scanning angle θ is varied three times. However, it should be noted that the number of times the scanning angle θ is varied is not to be limited to three. How many times the scanning angle θ is varied is determined in dependence on an accuracy with which circuit patterns are aligned with each other.

In the above-mentioned embodiment, the reflected electrons 22 are detected by means of the reflected electron detector 17. However, it should be noted that secondary electrons might be detected for determining a width W of the alignment mark 41 by means of a secondary electron detector such as a scintillator.

Second Embodiment

Figure 6:
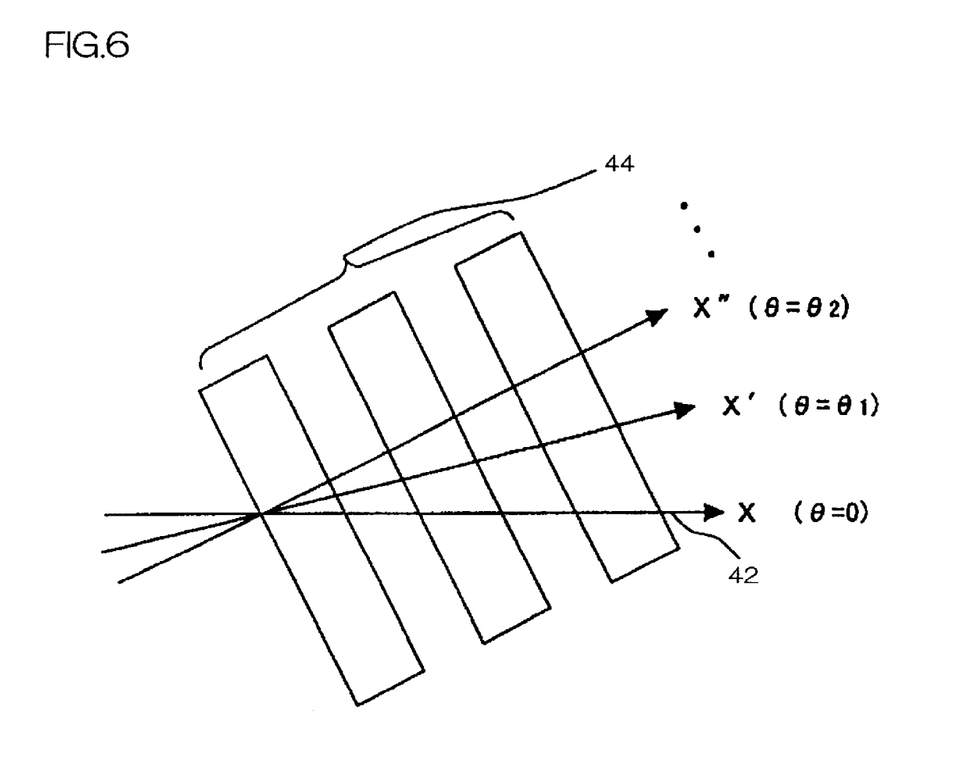
FIG. 6 is an enlarged view of an alignment mark in accordance with the second embodiment.

FIG. 6 illustrates an alignment mark 44 to be used in the second embodiment. The alignment mark 44 is comprised of three rectangles each having a longer side in the Y'-axis direction and a shorter side in the X'-axis direction in the X'-Y' coordinate system associated with the semiconductor device 40. The rectangles are arranged in parallel with one another, and are designed to have the same width.

An angular gap θ' between the X'-Y' coordinate system associated with the semiconductor device 40 and the X-Y coordinate system associated with the X-Y stage 15 is determined in the same manner as that of the above-mentioned first embodiment.

First, as illustrated in FIG. 4A, the alignment mark 44 is scanned with the electron beam 42 in a direction parallel to the X-axis direction (θ=0) of the X-Y coordinate system associated with the X-Y stage 15 in such a manner that the electron beam 42 runs entirely across the alignment mark 44. As a result, a width W of the alignment mark 44 along the scanning direction (θ=0) is determined. In the instant embodiment, a width W of the alignment mark 44 is equal to a sum of widths of the three rectangles constituting the alignment mark 44. Scanning the alignment mark 44 including the three rectangles is equivalent to scanning the alignment mark 41 in the first embodiment three times.

Then, the computer 3 controls the electron beam deflection control circuit 31 so as to rotate the scanning direction of the electron beam 42 by an angle of θ1, θ2,—in a counterclockwise direction. Namely, the scanning direction is successively varied to directions X', X",—, as illustrated in FIG. 6. Then, a width W(θ1), W(θ2),—of the alignment mark 44 along each of the scanning directions (θ=θ1, θ=θ2,—) is determined based on the curve 43. Similarly to the first embodiment, the computer 3 finds a minimum width among the thus determined widths, and determines a scanning angle associated with the minimum width as an angular gap θ between the X-Y coordinate system associated with the X-Y stage 15 and the X'-Y' coordinate system associated with the semiconductor device 40.

In accordance with the second embodiment, the number of rectangles or straight lines constituting the alignment mark 44 is increased. This provides an advantage that a single rectangle is scanned a plurality of times. Accordingly, the second embodiment makes it possible to scan an alignment mark in a shorter period of time than a time necessary for scanning a single alignment mark a plurality of times.

The number of rectangles constituting the alignment mark 44 is not to be limited to three. The alignment mark 44 may be comprised of four or greater rectangles or straight lines.

Third Embodiment

Figure 7:
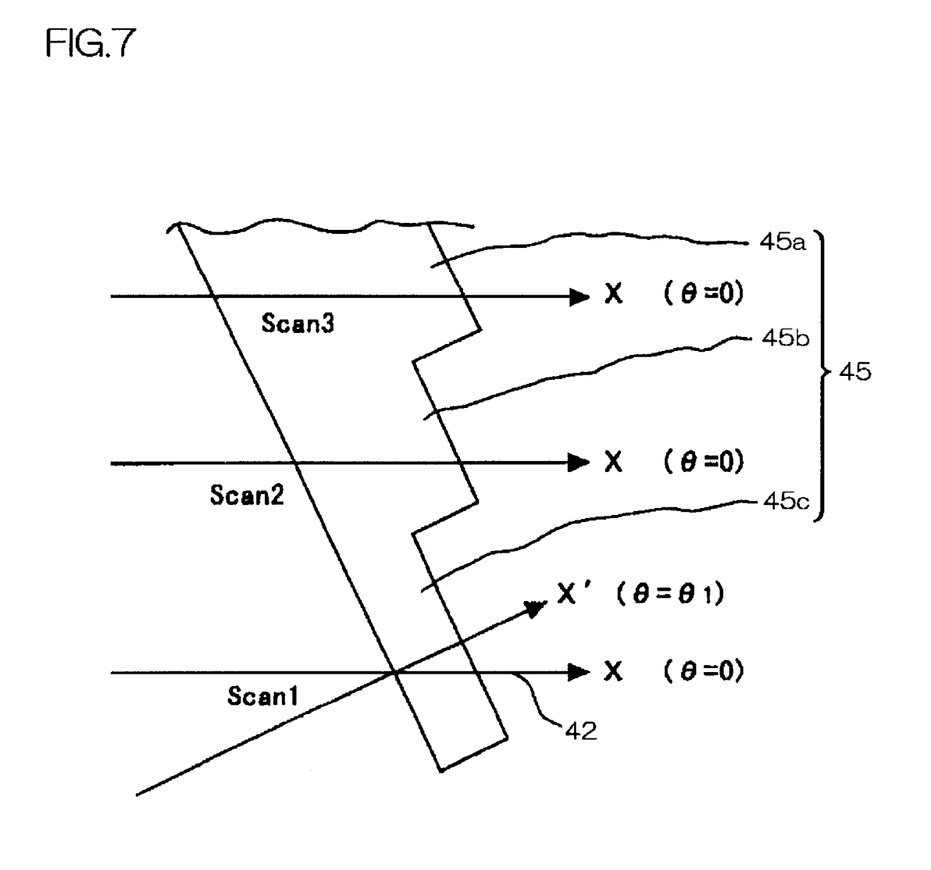
FIG. 7 is an enlarged view of an alignment mark in accordance with the third embodiment.

FIG. 7 illustrates an alignment mark 45 to be used in the third embodiment. The alignment mark 45 is comprised of straight-line or rectangular portions 45a, 45b and 45c having different widths. The first rectangular portion 45a has a greater width than a width of the second rectangular portion 45b, which in turn has a greater width than a width of the third rectangular portion 45c. Specifically, the first rectangular portion 45a has a width three times greater than a width of the third rectangular portion 45c, and the second rectangular portion 45b has a width twice greater than a width of the third rectangular portion 45c.

The alignment mark 45 may be scanned with the electron beam 42 at any one of the first, second and third rectangular portions 45a 45b and 45c. For instance, the alignment mark 45 may be scanned with the electron beam across the third rectangular portion 45c with the scanning angle θ being varied, to thereby determine the angular gap θ'. The alignment mark 45 may be scanned across the first or second rectangular portion 45a or 45b for determining the angular gap θ'. As an alternative, the alignment mark 45 may be scanned across one or more of the first to third rectangular portions 45a to 45c, which ensures a higher accuracy in determining the angular gap θ'.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-110441 filed on Apr. 11, 1997 including specification, claims, drawings and summary is incorporated herein by reference in its entirety.

What is claimed is:

1. A method of aligning a semiconductor substrate with a base stage on which said semiconductor substrate is placed, in the process of forming a circuit pattern directly onto said semiconductor substrate with electron beams, said method comprising the steps of:

(a) scanning across an alignment mark formed on a surface of said semiconductor substrate with electron beams with a scanning angle, defined as an angle between a direction of said electron beams and a reference direction, being varied;

(b) calculating a width of said alignment mark along a scanning direction for each of scanning angles; and (c) determining a minimum width among widths calculated in said step (b), and defining a scanning angle associated with said minimum width as an angular gap between said semiconductor substrate and said base stage.

2. The method as set forth in claim 1, wherein a width of said alignment mark along a scanning direction for each of scanning angles is calculated based on electron beams reflected from said alignment mark.

3. The method as set forth in claim 1, wherein a width of said alignment mark along a scanning direction for each of scanning angles is calculated based on secondary electrons emitted from said alignment mark.

4. The method as set forth in claim 1, wherein said reference direction is an X-axis direction of said base stage.

5. The method as set forth in claim 1, wherein said alignment mark is scanned a plurality of times for each of said scanning angles.

6. The method as set forth in claim 1, wherein said alignment mark is comprised of a straight line having a certain width.

7. The method as set forth in claim 1, wherein said alignment mark is comprised of a plurality of straight lines each having a certain width, arranged in parallel with one another.

8. The method as set forth in claim 7, wherein said straight lines have the same width.

9. The method as set forth in claim 1, wherein said alignment mark is comprised of a mark including at least one straight-line portion.

10. The method as set forth in claim 1, wherein said alignment mark is comprised of straight-line portions having different widths.

11. An electron beam radiating apparatus for forming a circuit pattern directly onto a semiconductor substrate with electron beams, comprising:

(a) an X-Y stage on which a semiconductor substrate is to be placed;

(b) an electron beam scanner for scanning across an alignment mark formed on a surface of said semiconductor substrate with electron beams with a scanning angle, defined as an angle between a direction of said electron beams and a reference direction, being varied; and (c) a control unit for calculating a width of said alignment mark along a scanning direction for each of scanning angles, determining a minimum width among the thus calculated widths, and defining a scanning angle associated with said minimum width as an angular gap between said semiconductor substrate and said X-Y stage.

12. The electron beam radiating apparatus as set forth in claim 11, wherein said control unit calculates a width of said alignment mark along a scanning direction for each of scanning angles, based on electron beams reflected from said alignment mark.

13. The electron beam radiating apparatus as set forth in claim 11, wherein said control unit calculates a width of said alignment mark along a scanning direction for each of scanning angles, based on secondary electrons emitted from said alignment mark.

14. The electron beam radiating apparatus as set forth in claim 11, wherein said reference direction is an X-axis direction of said X-Y stage.

15. The electron beam radiating apparatus as set forth in claim 11, wherein said electron beam scanner scans said alignment mark a plurality of times for each of said scanning angles.

16. A combination of an electron beam radiating apparatus and a semiconductor substrate onto which a circuit pattern is to be directly formed with electron beams emitted from said electron beam radiating apparatus, said semiconductor substrate being formed on a surface thereof with an alignment mark having a certain width, said electron beam radiating apparatus comprising:
(a) an X-Y stage on which said semiconductor substrate is to be placed;
(b) an electron beam scanner for scanning across said alignment mark with electron beams with a scanning angle, defined as an angle between a direction of said electron beams and a reference direction, being varied; and
(c) a control unit for calculating a width of said alignment mark along a scanning direction for each of scanning angles, determining a minimum width among the thus calculated widths, and defining a scanning angle associated with said minimum width as an angular gap between said semiconductor substrate and said X-Y stage.

17. The combination as set forth in claim 16, wherein said control unit calculates a width of said alignment mark along a scanning direction for each of scanning angles, based on electron beams reflected from said alignment mark.

18. The combination as set forth in claim 16, wherein said control unit calculates a width of said alignment mark along a scanning direction for each of scanning angles, based on secondary electrons emitted from said alignment mark.

19. The combination as set forth in claim 16, wherein said reference direction is an X-axis direction of said X-Y stage.

20. The combination as set forth in claim 16, wherein said electron beam scanner scans said alignment mark a plurality of times for each of said scanning angles.

21. The combination as set forth in claim 16, wherein said alignment mark is comprised of a straight line having a certain width.

22. The combination as set forth in claim 16, wherein said alignment mark is comprised of a plurality of straight lines each having a certain width, arranged in parallel with one another.

23. The combination as set forth in claim 22, wherein said straight lines have the same width.

24. The combination as set forth in claim 16, wherein said alignment mark is comprised of a mark including at least one straight-line portion.

25. The combination as set forth in claim 16, wherein said alignment mark is comprised of straight-line portions having different widths.

* * * * *